United States Patent
Davarpanah et al.

(10) Patent No.: US 12,282,073 B2
(45) Date of Patent: Apr. 22, 2025

(54) INTER-TURN FAULT DETECTION IN CURRENT TRANSFORMERS

(71) Applicants: Mahdi Davarpanah, Tehran (IR); Mohammad Rasoul Noori, Tehran (IR); Abbas Torkamani, Tehran (IR); Hossein Dadashi Ilkhechi, Tehran (IR)

(72) Inventors: Mahdi Davarpanah, Tehran (IR); Mohammad Rasoul Noori, Tehran (IR); Abbas Torkamani, Tehran (IR); Hossein Dadashi Ilkhechi, Tehran (IR)

(73) Assignee: Electronic Sazan Fan Aria Company (IR)

( * ) Notice: Subject to any disclaimer, the term of this patent is extended or adjusted under 35 U.S.C. 154(b) by 148 days.

(21) Appl. No.: 18/321,815

(22) Filed: May 23, 2023

(65) Prior Publication Data
US 2023/0288498 A1    Sep. 14, 2023

Related U.S. Application Data

(60) Provisional application No. 63/344,640, filed on May 23, 2022.

(51) Int. Cl.
G01R 31/62    (2020.01)
(52) U.S. Cl.
CPC ..................... *G01R 31/62* (2020.01)
(58) Field of Classification Search
CPC ........................................ G01R 31/62
USPC ........................................... 324/547
See application file for complete search history.

(56) References Cited

U.S. PATENT DOCUMENTS

| | | | | |
|---|---|---|---|---|
| 2008/0042683 | A1* | 2/2008 | Kasztenny | H02H 1/0092 324/765.01 |
| 2012/0158325 | A1* | 6/2012 | Banerjee | G01R 29/20 702/58 |
| 2014/0117912 | A1* | 5/2014 | Gajic | H02H 7/06 318/490 |
| 2017/0227594 | A1* | 8/2017 | Zhang | H02H 7/045 |
| 2018/0191241 | A1* | 7/2018 | Satheesh | G05F 3/02 |

FOREIGN PATENT DOCUMENTS

CN    106054015 A  * 10/2016  ............. G01R 31/62

* cited by examiner

*Primary Examiner* — Tung X Nguyen
*Assistant Examiner* — Robert P Alejnikov, Jr.

(57) ABSTRACT

A method for inter-turn fault detection in a current transformer (CT). The method includes obtaining a first inter-turn fault index of the CT, obtaining a second inter-turn fault index of the CT, and detecting an inter-turn fault in the CT based on the first inter-turn fault index and the second inter-turn fault index. Obtaining the first inter-turn fault index includes coupling an AC power supply to a secondary winding of the CT, measuring an electric current passing through the AC power supply, obtaining a hysteresis curve of the CT from the electric current, and calculating the first inter-turn fault index according to the hysteresis curve. Obtaining the second inter-turn fault index includes injecting an AC current to a primary winding of the CT, measuring an open-circuit voltage waveform of the secondary winding, and calculating the second inter-turn fault index according to the open-circuit voltage waveform.

19 Claims, 11 Drawing Sheets

INTER-TURN FAULT DETECTION IN CURRENT TRANSFORMERS

CROSS-REFERENCE TO RELATED APPLICATION

This application claims the benefit of priority from U.S. Provisional Patent Application Ser. No. 63/344,640 filed on May 23, 2022, and entitled "TEST METHOD AND DEVICE FOR INTER-TURN FAULT DETECTION IN CURRENT TRANSFORMER", which is incorporated herein by reference in its entirety.

TECHNICAL FIELD

The present disclosure generally relates to transformers, and particularly, to current transformers.

BACKGROUND

Prominent roles of current transformers (CTs) include scaling down a current level with a specific ratio and limited error of turn ratio and phase displacement. A short-circuit fault in a primary- or secondary-side winding, known as an inter-turn fault, is a main reason for turn ratio error increment of CTs. Multiple turns are usually employed in primary windings of low- and medium-voltage CTs with low turn ratios. Therefore, an inter-turn fault may occur in both primary and secondary windings. In contrast, high-voltage CTs with a single-turn primary conductor may experience such fault in secondary-side windings.

If a short-circuit fault happens in a limited portion of a CT winding, an inter-turn fault may be hard to detect by conventional on-site tests, such as turn ratio and knee-point voltage tests. However, if such a fault is not discovered in a CT, an arcing or severe insulation failure may happen when a high fault current passes through its primary conductor due to a short-circuit in a power system. As a result, further damage may be propagated to a faulty CT and may even lead to a CT explosion.

There is, therefore, a need for a method for an accurate and sensitive detection of inter-turn faults in primary- or secondary-winding of CTs. There is further a need for a method for inter-turn fault detection in CTs that may be easily implemented in widely-used on-site diagnostic test hardware. There is also a need for a cost-efficient system for an accurate and sensitive inter-turn fault detection in CTs.

SUMMARY

This summary is intended to provide an overview of the subject matter of this patent, and is not intended to identify essential elements or key elements of the subject matter, nor is it intended to be used to determine the scope of the claimed implementations. The proper scope of this patent may be ascertained from the claims set forth below in view of the detailed description below and the drawings.

In one general aspect, the present disclosure describes an exemplary method for inter-turn fault detection in a current transformer (CT). An exemplary method may include obtaining a first inter-turn fault index of the CT at a test time, obtaining a second inter-turn fault index of the CT at the test time, and detecting an inter-turn fault in the CT responsive to the first inter-turn fault index satisfying a first inter-turn fault condition or the second inter-turn fault index satisfying a second inter-turn fault condition. An exemplary first inter-turn fault condition may include the first inter-turn fault index being larger than a first fault threshold. An exemplary second inter-turn fault condition may include the second inter-turn fault index being larger than a second fault threshold.

In an exemplary embodiment, obtaining the first inter-turn fault index may include applying an AC voltage across a secondary winding of the CT by coupling an AC power supply to the secondary winding, measuring the AC voltage, measuring an electric current passing through the AC power supply responsive to applying the AC voltage across the secondary winding, obtaining a hysteresis curve of the CT from the AC voltage and the electric current, and calculating the first inter-turn fault index according to the hysteresis curve. In an exemplary embodiment, obtaining the second inter-turn fault index may include injecting an AC current to a primary winding of the CT, measuring an open-circuit voltage waveform of the secondary winding responsive to injecting the AC current to the primary winding, and calculating the second inter-turn fault index according to the open-circuit voltage waveform.

An exemplary method may further include obtaining the first normalization factor at an initial time earlier than the test time. In an exemplary embodiment, obtaining the first normalization factor may include applying a sinusoidal voltage across the secondary winding, obtaining an initial hysteresis curve of the CT from the sinusoidal voltage, and calculating the first normalization factor according to the initial hysteresis curve.

In an exemplary embodiment, applying the sinusoidal voltage across the secondary winding may include generating the sinusoidal voltage, setting an amplitude of the sinusoidal voltage equal to a knee-point voltage of the CT, setting a frequency of the sinusoidal voltage equal to a measurement frequency of the knee-point voltage, and reducing the amplitude and the frequency of the sinusoidal voltage responsive the knee-point voltage being higher than a first voltage threshold.

An exemplary method may further include obtaining the second normalization factor at the initial time. In an exemplary embodiment, obtaining the second normalization factor may include generating a sinusoidal current, setting a frequency of the sinusoidal current equal to the measurement frequency, injecting the sinusoidal current to the primary winding, measuring an initial open-circuit voltage waveform of the secondary winding responsive to injecting the sinusoidal current to the primary winding, reducing the amplitude of the initial open-circuit voltage waveform to lower than a second voltage threshold by reducing the frequency of the sinusoidal current responsive to an amplitude of the initial open-circuit voltage waveform being higher than the second voltage threshold, adjusting the amplitude of the sinusoidal current based on the amplitude of the initial open-circuit voltage waveform, and calculating the second normalization factor according to the initial open-circuit voltage waveform.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein are disclosed an exemplary method and an exemplary system for inter-turn fault detection in current transformers (CTs). In an exemplary embodiment, a CT may refer to a type of transformer that is used to reduce or multiply an alternating current (AC). An exemplary CT may produce an electric current in its secondary winding which may be proportional to an electric current in its primary winding. An exemplary method may obtain two fault indices. An exemplary first fault index may be extracted from a hysteresis curve of a secondary winding of an exemplary CT. An exemplary second fault index may be defined based on different harmonics of an open-circuit voltage waveform of the secondary winding that may be produced in response to injecting an AC current to a primary winding of an exemplary CT. If any of exemplary fault indices is above a specific threshold, an inter-turn fault may be detected in the CT. Otherwise, an exemplary CT may be considered healthy.

Figure 1A:
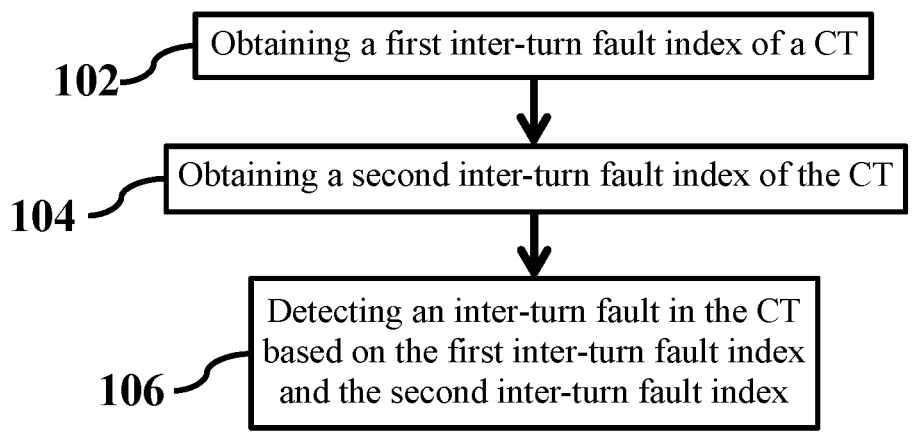
FIG. 1A shows a flowchart of a method for inter-turn fault detection in a current transformer (CT), consistent with one or more exemplary embodiments of the present disclosure.

FIG. 1A shows a flowchart of a method for inter-turn fault detection in a CT, consistent with one or more exemplary embodiments of the present disclosure. An exemplary method 100 may include obtaining a first inter-turn fault index of the CT at a test time (step 102), obtaining a second inter-turn fault index of the CT at the test time (step 104), and detecting an inter-turn fault in the CT responsive to the first inter-turn fault index satisfying a first inter-turn fault condition or the second inter-turn fault index satisfying a second inter-turn fault condition (step 106). In an exemplary embodiment, the "test time" may refer to a time in which method 100 is implemented, more specifically "test time" may refer to an instantaneous moment where exemplary steps 102 and 104 are conducted.

Figure 1B:
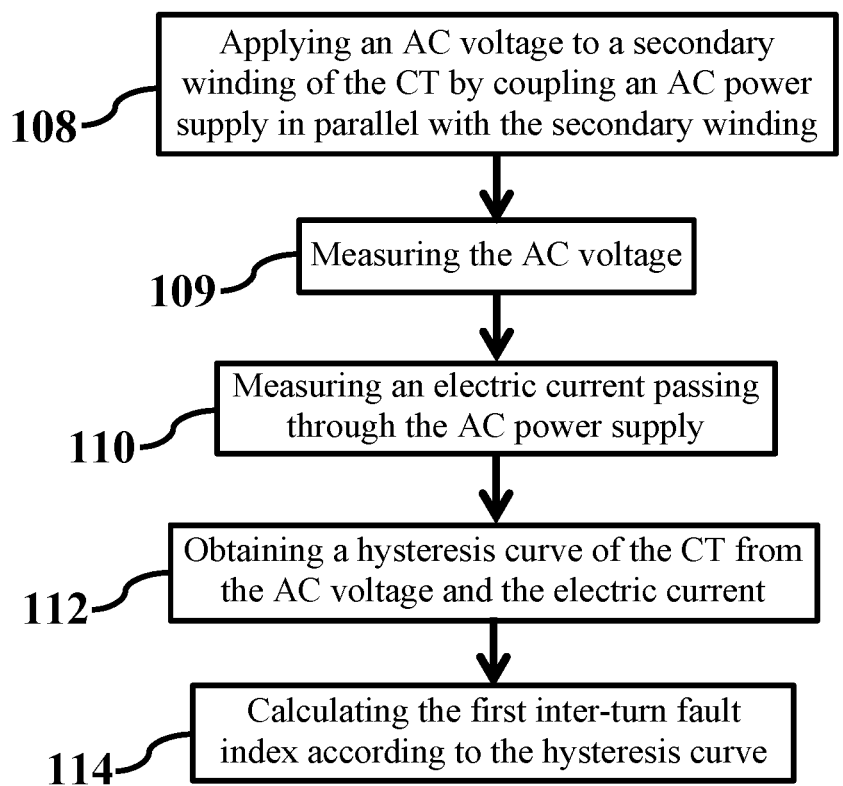
FIG. 1B shows a flowchart for obtaining a first inter-turn fault index of a CT, consistent with one or more exemplary embodiments of the present disclosure.

In further detail regarding step 102, FIG. 1B shows a flowchart for obtaining a first inter-turn fault index of a CT, consistent with one or more exemplary embodiments of the present disclosure. In an exemplary embodiment, step 102 may include applying an AC voltage across a secondary winding of the CT by coupling an AC power supply to the secondary winding (step 108), measuring the AC voltage (step 109), measuring an electric current passing through the AC power supply responsive to applying the AC voltage to the secondary winding (step 110), obtaining a hysteresis curve of the CT from the AC voltage and the electric current (step 112), and calculating the first inter-turn fault index according to the hysteresis curve (step 114).

Figure 2A:
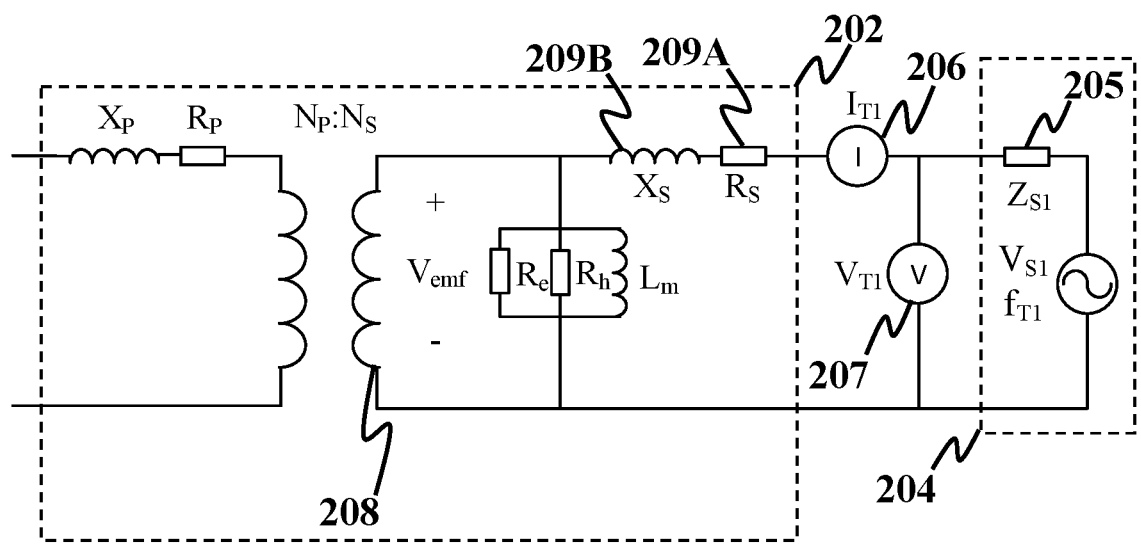
FIG. 2A shows a schematic of a setup for obtaining a first inter-turn fault index of a CT, consistent with one or more exemplary embodiments of the present disclosure.

FIG. 2A shows a schematic of a setup for obtaining a first inter-turn fault index of a CT, consistent with one or more exemplary embodiments of the present disclosure. An exemplary setup 200A may be utilized to obtain a first inter-turn fault index of a CT 202. In an exemplary embodiment, setup 200A may include an AC power supply 204, a current sensor 206, and a voltage sensor 207. In an exemplary embodiment, an "AC power supply" may refer to an electrical device that may produce an AC voltage across its terminals. In an exemplary embodiment, AC power supply 204 may have an internal impedance 205. In an exemplary embodiment, a "current sensor" may refer to a device that measures an electric current by producing a signal that is proportional to the electric current. In an exemplary embodiment, a "voltage sensor" may refer to a device that measures an electric potential by producing a signal that is proportional to the electric potential. In an exemplary embodiment, current sensor 206 may be coupled in series with AC power supply 204 and voltage sensor 207 may be coupled in parallel with AC power supply 204. In an exemplary embodiment, different steps of flowchart 102 may be implemented utilizing setup 200A, as described below.

Referring to FIGS. 1B and 2A, in an exemplary embodiment, step 108 may include applying an AC voltage $V_{T1}$ across a secondary winding 208 of CT 202 by coupling AC power supply 204 to secondary winding 208. In an exemplary embodiment, applying the AC voltage across secondary winding 208 may include applying a sinusoidal voltage to secondary winding 208. Therefore, in an exemplary embodiment, AC voltage $V_{T1}$ may be sinusoidal, as described in step 118 below.

In an exemplary embodiment, step 109 may include measuring AC voltage $V_{T1}$. For this purpose, in an exemplary embodiment, voltage sensor 207 may be connected across secondary winding 208. As a result, AC voltage $V_{T1}$ may be applied across voltage sensor 207 and may be accordingly measured by voltage sensor 207.

In an exemplary embodiment, step 110 may include measuring an electric current $I_{T1}$ that may pass through AC power supply 204 due to applying AC voltage $V_{T1}$ across secondary winding 208. For this purpose, in an exemplary embodiment, current sensor 206 may be connected in series to secondary winding 208. As a result, electric current $I_{T1}$ may pass through current sensor 206 and may be accordingly measured by current sensor 206.

In an exemplary embodiment, step 112 may include obtaining a hysteresis curve of CT 202 from AC voltage $V_{T1}$ and electric current $I_{T1}$. For this purpose, an exemplary electromagnetic force $V_{emf}$ of CT 202 may be estimated according to the following:

$$V_{emf} \cong V_{T1} - R_S \times I_{T1} \qquad \text{Equation (1)}$$

where $R_S$ is an internal resistance 209A of secondary winding 208. In an exemplary embodiment, Equation (1) may be a valid estimation of electromagnetic force $V_{emf}$ since an internal reactance 209B of secondary winding 208 may be negligible compared to internal resistance 209A. An exemplary integral of electromagnetic force $V_{emf}$ may be calculated to obtain a flux-turn induced in a core of CT 202. A curve showing variations of the induced flux-turn with respect to electric current $I_{T1}$ may be referred to as the hysteresis curve of CT 202.

Figure 3:
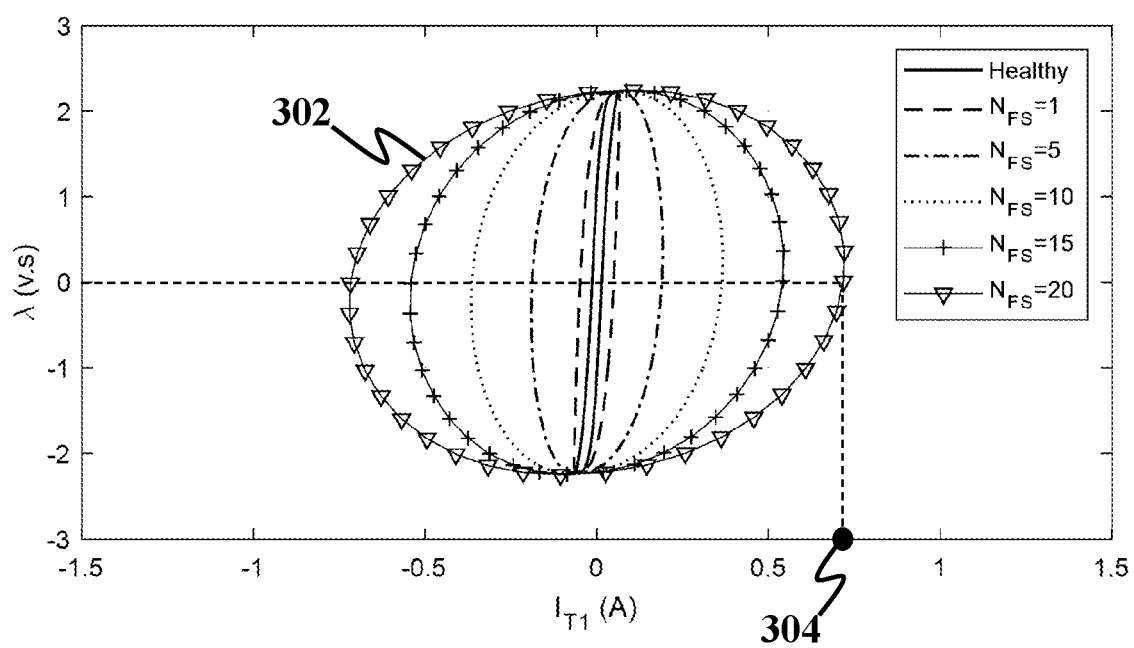
FIG. 3 shows a chart of hysteresis curves of a CT for different short-circuited turns in windings of a secondary side, consistent with one or more exemplary embodiments of the present disclosure.

In further detail with respect to step 114, FIG. 3 shows a chart 300 of hysteresis curves of a CT for different short-circuited turns in windings of a secondary side, consistent with one or more exemplary embodiments of the present disclosure. For example, a curve 302 is a hysteresis curve of CT 202 for 20 short-circuited turns in windings of secondary side 208. Referring to FIGS. 1B, 2A, and 3, in an exemplary embodiment, the first inter-turn fault index may be calculated in step 114 according to the following:

$$IFI_1 = A_{HYS} \times I_{T1-max} / IFI_{1base} \qquad \text{Equation (2)}$$

where $IFI_1$ is the first inter-turn fault index, $A_{HYS}$ is a size of an area surrounded by a hysteresis curve (for example, curve 302), $I_{T1-max}$ is a zero-crossing of the hysteresis curve, and $IFI_{1base}$ is a first normalization factor. In an exemplary embodiment, the zero-crossing may refer to a value of electric current $I_{T1}$ at which the magnetic flux-turn (represented by parameter $\lambda$ in FIG. 3) in the core of CT 202 becomes zero. For example, a point 304 is a zero-crossing of curve 302.

Figure 1C:
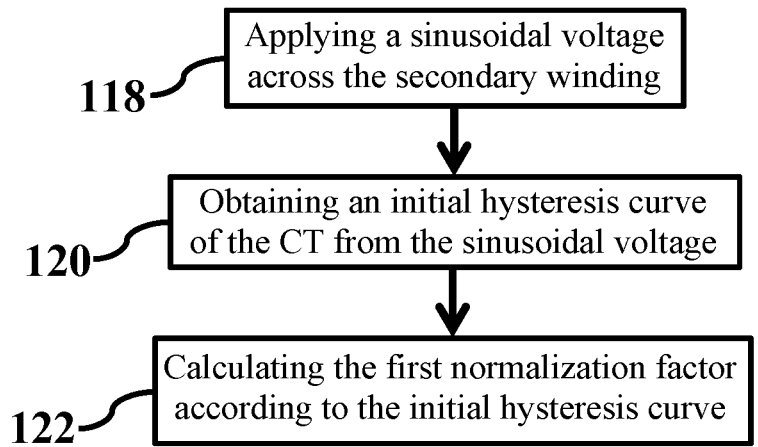
FIG. 1C shows a flowchart of a method for obtaining a first normalization factor, consistent with one or more exemplary embodiments of the present disclosure.

In an exemplary embodiment, first normalization factor $IFI_{1base}$ may be obtained prior to starting method 100 at an initial time earlier than the test time. FIG. 1C shows a flowchart of a method for obtaining a first normalization factor, consistent with one or more exemplary embodiments of the present disclosure. An exemplary method 116 may include applying a sinusoidal voltage across the secondary winding (step 118), obtaining an initial hysteresis curve of the CT from the sinusoidal voltage (step 120), and calculating the first normalization factor according to the initial hysteresis curve (step 122). In an exemplary embodiment, the initial time may be a time when CT 202 is considered healthy (such as when CT 202 is manufactured).

Figure 1D:
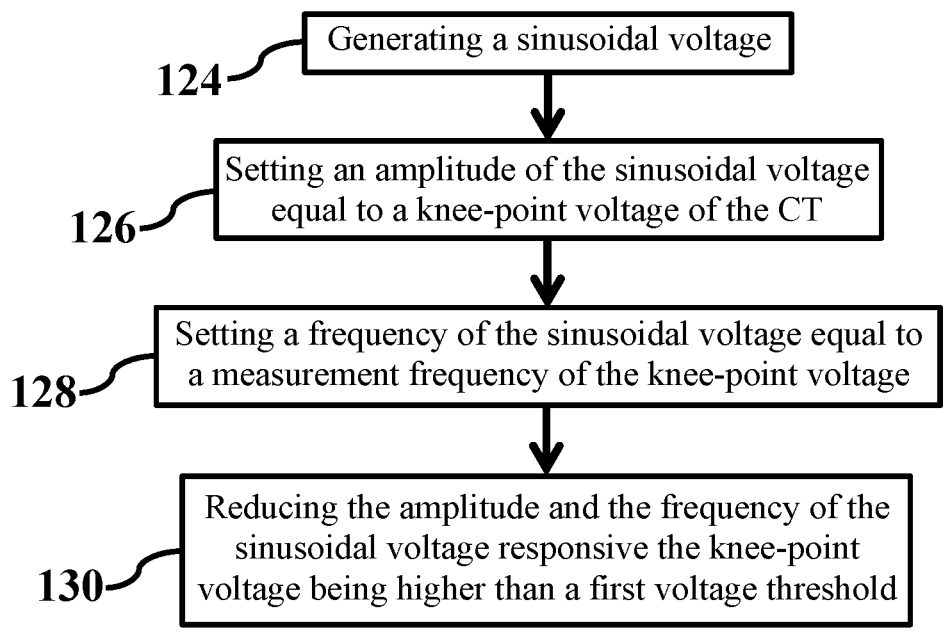
FIG. 1D shows a flowchart for applying a sinusoidal voltage across a secondary winding of a CT, consistent with one or more exemplary embodiments of the present disclosure.

In an exemplary embodiment, step 118 may include applying a sinusoidal voltage across secondary winding 208. FIG. 1D shows a flowchart for applying a sinusoidal voltage across a secondary winding of a CT, consistent with one or more exemplary embodiments of the present disclosure. In an exemplary embodiment, step 118 may include generating the sinusoidal voltage (step 124), setting an amplitude of the sinusoidal voltage equal to a knee-point voltage of the CT (step 126), setting a frequency of the sinusoidal voltage equal to a measurement frequency of the knee-point voltage (step 128), and reducing the amplitude and the frequency of the sinusoidal voltage responsive to the knee-point voltage being higher than a first voltage threshold (step 130).

Referring to FIGS. 1C and 2A, in an exemplary embodiment, step 124 may include generating sinusoidal voltage $V_{T1}$ utilizing AC power supply 204. For this purpose, an exemplary output signal of AC power supply 204 may be set to a sine wave with a frequency $f_{T1}$ and an amplitude $V_{S1}$. As a result, in an exemplary embodiment, sinusoidal voltage $V_{T1}$ may be applied to secondary winding 208.

In an exemplary embodiment, step 126 may include setting the amplitude of sinusoidal voltage $V_{T1}$ equal to the knee-point voltage of CT 202. In an exemplary embodiment, a "knee-point voltage" of CT 202 may refer to a value of electromagnetic force $V_{emf}$ if at which an about 10% increase in amplitude of electromagnetic force $V_{emf}$ if may increase a magnetization current of CT 202 by about 50%. An exemplary knee-point voltage may be measured prior to starting method 100 by applying an AC voltage to CT 202 and measuring a resulting magnetization current of CT 202. To set the amplitude of sinusoidal voltage $V_{T1}$, in an exemplary embodiment, amplitude $V_{S1}$ may be gradually increased while sinusoidal voltage $V_{T1}$ is measured by voltage sensor 207 until the resulting magnetization current shows about 50% increase in amplitude for about 10% increase in sinusoidal V voltage $V_{T1}$.

In an exemplary embodiment, step 128 may include setting the frequency of sinusoidal voltage $V_{T1}$ (which may be the same as frequency $f_{T1}$) equal to the measurement frequency of the knee-point voltage. In an exemplary embodiment, a "measurement frequency" of the knee-point voltage may refer to a frequency at which the knee-point voltage may be measured. Therefore, an exemplary measurement frequency may be equal to a frequency of a voltage that may be applied to CT 202 for knee-point voltage measurement described above. In an exemplary embodiment, frequency $f_{T1}$ may be set to the measurement frequency by adjusting the frequency of the output sine wave of AC power supply 204 described above in step 124.

In an exemplary embodiment, step 130 may include reducing the amplitude and the frequency of sinusoidal voltage $V_{T1}$ responsive to the knee-point voltage being higher than the first voltage threshold. If an exemplary knee-point voltage is higher than an exemplary first voltage threshold, amplitude $V_{T1}$ and frequency $f_{T1}$ may be set according to the following:

$$f_{T1} = f_1 \times V_{th1} / U_{kp} \qquad \text{Equation (3a)}$$

$$V_{T1} = V_{th1} \qquad \text{Equation (3b)}$$

where $f_1$ is the measurement frequency, $V_{th1}$ is the first voltage threshold, and $U_{kp}$ is the knee-point voltage of CT 202. In an exemplary embodiment, first voltage threshold $V_{th1}$ may be determined based on insulation of CT 202. If an exemplary applied voltage to CT 202 is excessively increased, insulation of CT 202 may be damaged. Therefore, in an exemplary embodiment, first voltage threshold $V_{th1}$ may be set to a voltage level above which an applied voltage to CT 202 may damage insulation of CT 202. In an exemplary embodiment, if amplitude $V_{T1}$ exceeds first voltage threshold $V_{th1}$, frequency $f_{T1}$ may be reduced from measurement frequency $f_1$ according to Equation (3a) to obtain a same amount of magnetic flux in CT 202 (that may be produced at knee-point voltage $U_{kp}$) in a lower level voltage of first voltage threshold $V_{th1}$. As a result, in an exemplary embodiment, amplitude $V_{T1}$ may be set to first voltage threshold $V_{th1}$ according to Equation (3b) by decreasing amplitude $V_{S1}$ of AC power supply 204 when frequency $f_{T1}$ is reduced according to Equation (3a). In an exemplary embodiment, first voltage threshold $V_{th1}$ may be set to about 1500 V.

Referring again to FIG. 1C, in an exemplary embodiment, step 120 may include obtaining an initial hysteresis curve of CT 202 from the initial sinusoidal voltage. An exemplary initial hysteresis curve may be similar to the hysteresis curve described above except that the initial hysteresis curve may be obtained at the initial time from sinusoidal voltage $V_{T1}$.

In an exemplary embodiment, details of step 120 may be similar to step 112 discussed above.

In an exemplary embodiment, step 122 may include calculating the first normalization factor according to the following:

$$IFI_{1base} = Ah_{HYS} \times Ih_{T1-max}$$ Equation (4)

where $Ah_{HYS}$ is a size of an area surrounded by the initial hysteresis curve (similar to $A_{HYS}$ in Equation 2) and $Ih_{T1-max}$ is a zero-crossing of the initial hysteresis curve (similar to $I_{T1-max}$ in Equation 2).

Figure 1E:
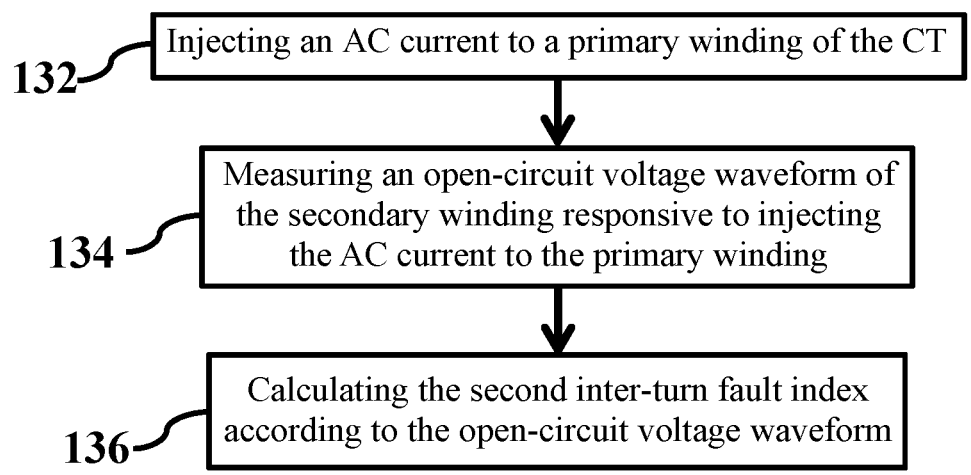
FIG. 1E shows a flowchart for obtaining a second inter-turn fault index of a CT, consistent with one or more exemplary embodiments of the present disclosure.

Referring again to FIGS. 1A and 2A, in an exemplary embodiment, step 104 may include obtaining the second inter-turn fault index of CT 202 at the test time. FIG. 1E shows a flowchart for obtaining a second inter-turn fault index of a CT, consistent with one or more exemplary embodiments of the present disclosure. In an exemplary embodiment, step 104 may include injecting an AC current to a primary winding of the CT (step 132), measuring an open-circuit voltage waveform of the secondary winding responsive to injecting the AC current to the primary winding (step 134), and calculating the second inter-turn fault index according to the open-circuit voltage waveform (step 136).

Figure 2B:
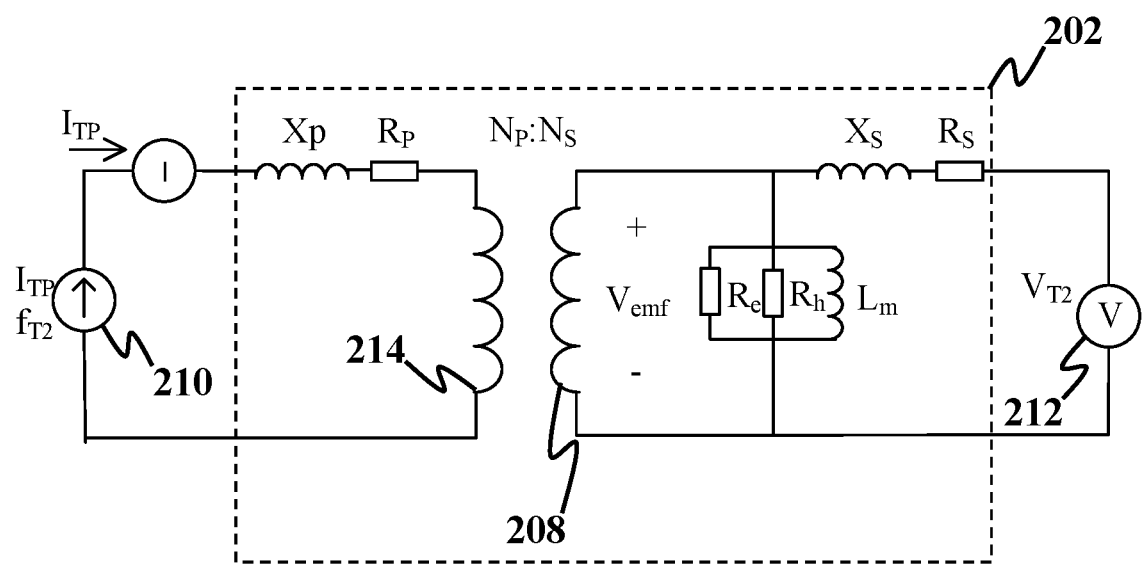
FIG. 2B shows a schematic of a setup for obtaining a second inter-turn fault index of a CT, consistent with one or more exemplary embodiments of the present disclosure.

FIG. 2B shows a schematic of a setup for obtaining a second inter-turn fault index of a CT, consistent with one or more exemplary embodiments of the present disclosure. An exemplary setup 200B may be utilized to obtain the second inter-turn fault index of CT 202. In an exemplary embodiment, setup 200B may include a current source 210 and a voltage sensor 212. In an exemplary embodiment, a "current source" may refer to an electrical device that may produce an electric current that passes through its terminals and is independent from a voltage across its terminals. In an exemplary embodiment, different steps of flowchart 104 may be implemented utilizing setup 200B, as described below.

Referring to FIGS. 1E and 2B, in an exemplary embodiment, step 132 may include injecting an AC current $I_{TP}$ to a primary winding 214 of CT 202. In an exemplary embodiment, injecting AC current $I_{TP}$ to primary winding 214 may include injecting a sinusoidal current to primary winding 214. Therefore, in an exemplary embodiment, AC current $I_{TP}$ may be sinusoidal, as described in step 137 below.

In an exemplary embodiment, step 134 may include measuring open-circuit voltage waveform $V_{T2}$ that may be induced on secondary winding 208 due to injecting AC current $I_{TP}$ to primary winding 214. For this purpose, in an exemplary embodiment, voltage sensor 212 may be connected across secondary winding 208 to measure open-circuit voltage waveform $V_{T2}$.

In an exemplary embodiment, step 136 may include calculating the second inter-turn fault index according to the following:

$$IFI_2 = IFI_{2base} \times \frac{V_{h1} - V_{h3}}{(V_{peak})^2}$$ Equation (5)

where $IFI_2$ is the second inter-turn fault index, $V_{h1}$ is an amplitude of a first harmonic of open-circuit voltage waveform $V_{T2}$, $V_{h3}$ is an amplitude of a third harmonic of open-circuit voltage waveform $V_{T2}$, and $IFI_{2base}$ is a second normalization factor.

Figure 1F:
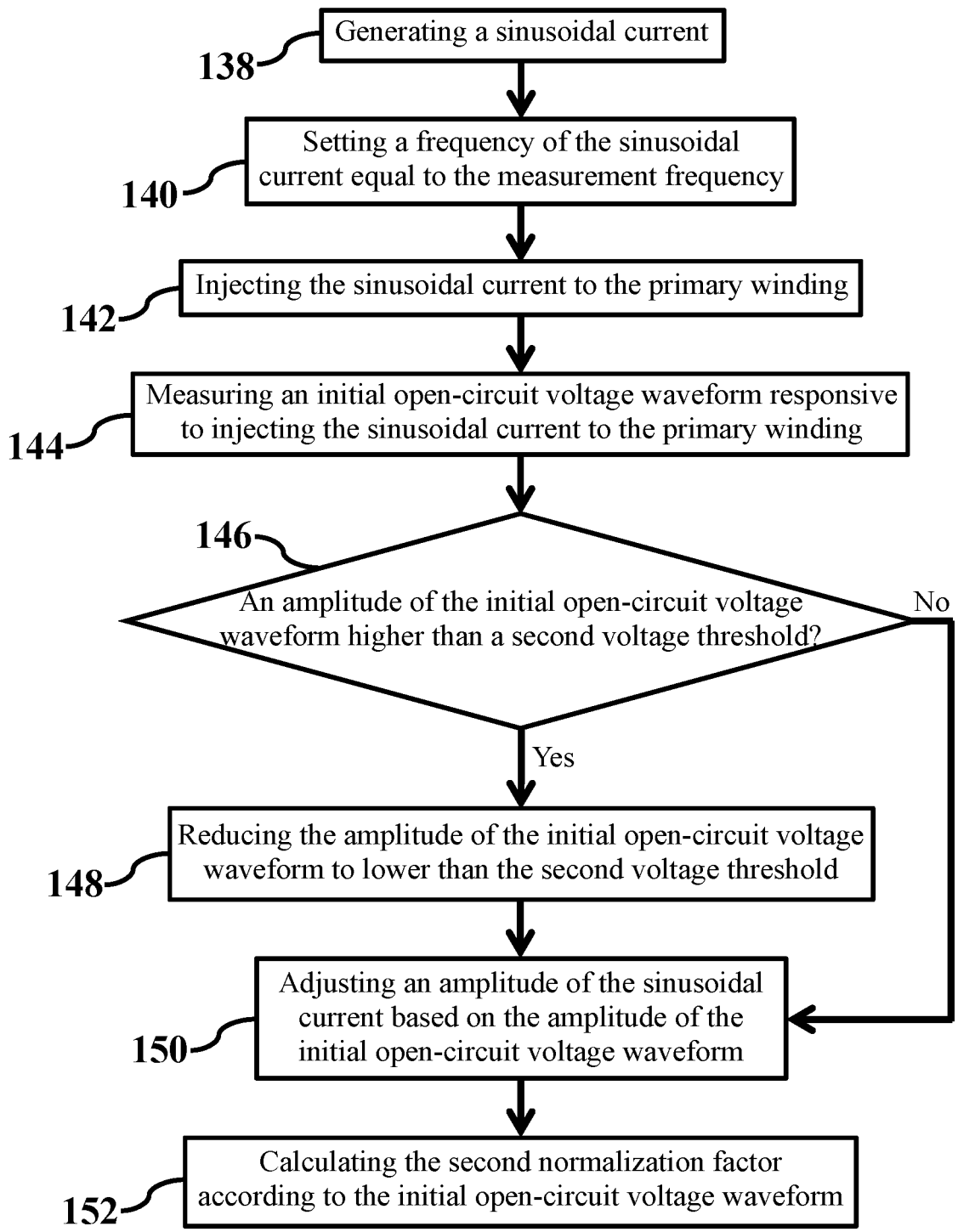
FIG. 1F shows a flowchart of a method for obtaining a second normalization factor, consistent with one or more exemplary embodiments of the present disclosure.

In an exemplary embodiment, second normalization factor $IFI_{2base}$ may be obtained prior to starting method 100 at the initial time. FIG. 1F shows a flowchart of a method for obtaining a second normalization factor, consistent with one or more exemplary embodiments of the present disclosure. An exemplary method 137 may include generating a sinusoidal current (step 138), setting a frequency of the sinusoidal current equal to the measurement frequency (step 140), injecting the sinusoidal current to the primary winding (step 142), measuring an initial open-circuit voltage waveform of the secondary winding responsive to injecting the sinusoidal current to the primary winding (step 144), reducing the amplitude of the initial open-circuit voltage waveform to lower than a second voltage threshold by reducing the frequency of the sinusoidal current (step 148) responsive to an amplitude of the initial open-circuit voltage waveform being higher than the second voltage threshold (step 146, yes) adjusting an amplitude of the sinusoidal current based on the amplitude of the initial open-circuit voltage waveform (step 150), and calculating the second normalization factor according to the initial open-circuit voltage waveform (step 152).

Referring to FIGS. 1F and 2B, in an exemplary embodiment, step 138 may include generating sinusoidal current $I_{TP}$ utilizing current source 210. For this purpose, an exemplary output signal of current source 210 may be set to a sine wave with a frequency $f_{T2}$ and an amplitude of $I_{TP}$.

In an exemplary embodiment, step 140 may include setting frequency $f_{T2}$ of sinusoidal current $I_{TP}$ equal to the measurement frequency of the knee-point voltage. In an exemplary embodiment, frequency $f_{T2}$ may be set to measurement frequency $f_1$ by adjusting the frequency of the output sine wave of current source 210 described above in step 138.

In an exemplary embodiment, step 142 may include injecting sinusoidal current $I_{TP}$ to primary winding 214. For this purpose, in an exemplary embodiment, current source 210 may be connected in series to primary winding 214. As a result, in an exemplary embodiment, sinusoidal current $I_{TP}$ may pass through primary winding 214.

In an exemplary embodiment, step 144 may include measuring an initial open-circuit voltage waveform that may be induced on secondary winding 208 due to injecting sinusoidal current $I_{TP}$ to primary winding 214. For this purpose, in an exemplary embodiment, voltage sensor 212 may be connected across secondary winding 208 to measure the induced voltage. In an exemplary embodiment, voltage sensor 212 may be the same as voltage sensor 207. An exemplary initial open-circuit voltage waveform may be similar to open-circuit voltage waveform $V_{T2}$ except that the initial open-circuit voltage waveform may be produced at the initial time in response to injecting sinusoidal current $I_{TP}$ to primary winding 214.

In an exemplary embodiment, step 146 may include comparing an amplitude of the initial open-circuit voltage waveform with the second voltage threshold. An exemplary second voltage threshold may be determined based on insulation of CT 202. Therefore, an exemplary second voltage threshold may be set to a voltage level above which an initial open-circuit voltage waveform may damage insulation of CT 202. In an exemplary embodiment, the second voltage threshold may be set to about 3000 V. If an exemplary amplitude of the initial open-circuit voltage waveform is higher than an exemplary second voltage threshold, method 137 may proceed to step 148. Otherwise, in an exemplary embodiment, method 137 may proceed to step 150, as described below.

In an exemplary embodiment, step 148 may include reducing the amplitude of the initial open-circuit voltage waveform to lower than the second voltage threshold. If an exemplary amplitude of the initial open-circuit voltage waveform is excessively increased, insulation of CT 202 may be damaged. Therefore, in an exemplary embodiment, if the amplitude of the initial open-circuit voltage waveform is higher than the second voltage threshold, frequency $f_{T2}$ of sinusoidal current $I_{TP}$ may be reduced from measurement frequency $f_1$ to obtain a same amount of magnetic flux in CT 202 in a lower level voltage of the initial open-circuit voltage waveform than the second voltage threshold.

In an exemplary embodiment, step 150 may include adjusting the amplitude of sinusoidal current $I_{TP}$. In an exemplary embodiment, $I_{TP}$ may be so adjusted that the core of CT 202 may be mildly saturated. For this purpose, in an exemplary embodiment, the amplitude of sinusoidal current $I_{TP}$ may be varied until the amplitude of the initial open-circuit voltage waveform satisfies a condition defined according to the following:

$$K_{min} \times \sqrt{2} \times U_{kp} \leq VH_{peak} \leq K_{max} \times \sqrt{2} \times U_{kp} \qquad \text{Condition (1)}$$

where $VH_{peak}$ is the amplitude of the initial open-circuit voltage waveform and $K_{min}$ and $K_{max}$ are constants where $K_{min} < K_{max}$. In an exemplary embodiment, $K_{min}$ may be set to about 1.75 for iron cores to ensure CT 202 is mildly saturated. In an exemplary embodiment, $K_{max}$ may be set equal to 1.2 times of $K_{min}$ to prevent a severe saturation of CT 202. To adjust the amplitude of sinusoidal current $I_{TP}$, in an exemplary embodiment, $I_{TP}$ may be gradually increased while $VH_{peak}$ is measured by voltage sensor 212 until Condition (1) is satisfied.

In an exemplary embodiment, step 152 may include calculating the second normalization factor according to the following:

$$IFI_{2base} \times \frac{(VH_{peak})^2}{VH_{h1} - VH_{h3}} \qquad \text{Equation (6)}$$

where $VH_{h1}$ is an amplitude of the first harmonic of the initial open-circuit voltage waveform and $VH_{h3}$ is an amplitude of the third harmonic of the initial open-circuit voltage waveform.

Referring to FIG. 1A, in an exemplary embodiment, step 106 may include detecting the inter-turn fault in CT 202 if the first inter-turn fault index satisfies the first inter-turn fault condition or the second inter-turn fault index satisfies a second inter-turn fault condition. An exemplary first inter-turn fault condition may include the first inter-turn fault index being larger than a first fault threshold. In an exemplary embodiment, the first fault threshold may be empirically set to about 1.7. An exemplary second inter-turn fault condition may include the second inter-turn fault index being larger than a second fault threshold. In an exemplary embodiment, the second fault threshold may be empirically set to about 1.3.

To implement step 106, in an exemplary embodiment, the first inter-turn fault index and the second inter-turn fault index may be compared with the first fault threshold and the second fault threshold, respectively. If, in an exemplary embodiment, any of the fault indices is larger than the corresponding fault threshold, the inter-turn fault may be detected in CT 202.

Figure 4:
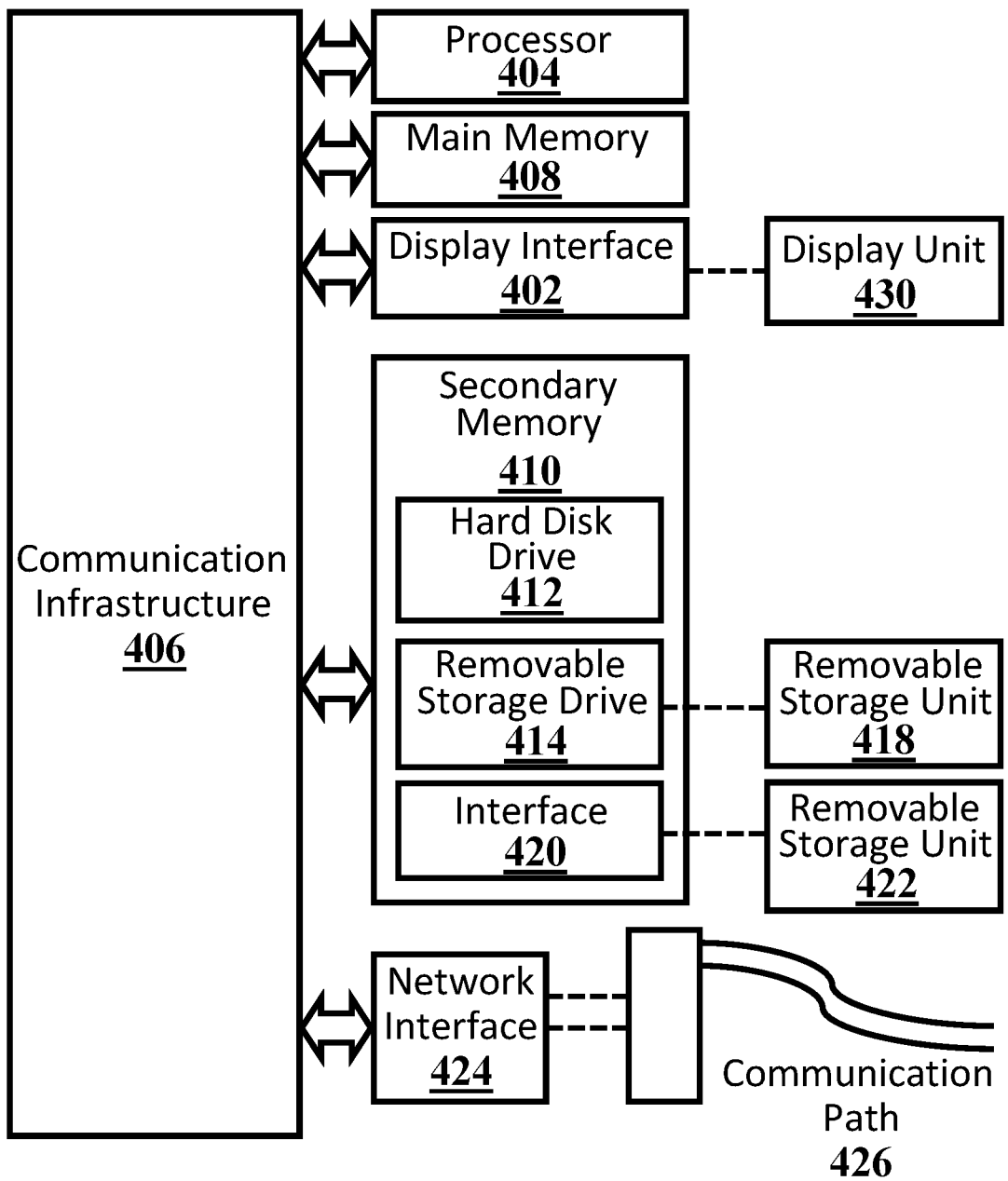
FIG. 4 shows a high-level functional block diagram of a computer system, consistent with one or more exemplary embodiments of the present disclosure.

FIG. 4 shows an example computer system 400 in which an embodiment of the present invention, or portions thereof, may be implemented as computer-readable code, consistent with exemplary embodiments of the present disclosure. For example, different steps of method 100 may be implemented in computer system 400 using hardware, software, firmware, tangible computer readable media having instructions stored thereon, or a combination thereof and may be implemented in one or more computer systems or other processing systems. Hardware, software, or any combination of such may embody any of the modules and components in FIGS. 1A-3.

If programmable logic is used, such logic may execute on a commercially available processing platform or a special purpose device. One ordinary skill in the art may appreciate that an embodiment of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer system 400. After reading this description, it will become apparent to a person skilled in the relevant art how to implement the invention using other computer systems and/or computer architectures. Although operations may be described as a sequential process, some of the operations may in fact be performed in parallel, concurrently, and/or in a distributed environment, and with program code stored locally or remotely for access by single or multiprocessor machines. In addition, in some embodiments the order of operations may be rearranged without departing from the spirit of the disclosed subject matter.

Processor device 404 may be a special purpose (e.g., a graphical processing unit) or a general-purpose processor device. As will be appreciated by persons skilled in the relevant art, processor device 404 may also be a single processor in a multi-core/multiprocessor system, such system operating alone, or in a cluster of computing devices operating in a cluster or server farm. Processor device 404 may be connected to a communication infrastructure 406, for example, a bus, message queue, network, or multi-core message-passing scheme.

In an exemplary embodiment, computer system 400 may include a display interface 402, for example a video connector, to transfer data to a display unit 430, for example, a monitor. Computer system 400 may also include a main memory 408, for example, random access memory (RAM), and may also include a secondary memory 410. Secondary memory 410 may include, for example, a hard disk drive 412, and a removable storage drive 414. Removable storage drive 414 may include a floppy disk drive, a magnetic tape drive, an optical disk drive, a flash memory, or the like. Removable storage drive 414 may read from and/or write to a removable storage unit 418 in a well-known manner. Removable storage unit 418 may include a floppy disk, a magnetic tape, an optical disk, etc., which may be read by and written to by removable storage drive 414. As will be appreciated by persons skilled in the relevant art, removable storage unit 418 may include a computer usable storage medium having stored therein computer software and/or data.

In alternative implementations, secondary memory 410 may include other similar means for allowing computer programs or other instructions to be loaded into computer system 400. Such means may include, for example, a removable storage unit 422 and an interface 420. Examples of such means may include a program cartridge and cartridge interface (such as that found in video game devices), a removable memory chip (such as an EPROM, or PROM) and associated socket, and other removable storage units 422 and interfaces 420 which allow software and data to be transferred from removable storage unit 422 to computer system 400.

Computer system 400 may also include a communications interface 424. Communications interface 424 allows software and data to be transferred between computer system 400 and external devices. Communications interface 424 may include a modem, a network interface (such as an Ethernet card), a communications port, a PCMCIA slot and card, or the like. Software and data transferred via communications interface 424 may be in the form of signals, which may be electronic, electromagnetic, optical, or other signals capable of being received by communications interface 424. These signals may be provided to communications interface 424 via a communications path 426. Communications path 426 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 418, removable storage unit 422, and a hard disk installed in hard disk drive 412. Computer program medium and computer usable medium may also refer to memories, such as main memory 408 and secondary memory 410, which may be memory semiconductors (e.g. DRAMs, etc.).

Computer programs (also called computer control logic) are stored in main memory 408 and/or secondary memory 410. Computer programs may also be received via communications interface 424. Such computer programs, when executed, enable computer system 400 to implement different embodiments of the present disclosure as discussed herein. In particular, the computer programs, when executed, enable processor device 404 to implement the processes of the present disclosure, such as the operations in method 100 illustrated by flowcharts of FIGS. 1A-FIG. 1F discussed above. Accordingly, such computer programs represent controllers of computer system 400. Where an exemplary embodiment of method 100 is implemented using software, the software may be stored in a computer program product and loaded into computer system 400 using removable storage drive 414, interface 420, and hard disk drive 412, or communications interface 424.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nano-technological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Example 1

In this example, performance of an implementation of method 100 for detecting an inter-turn fault in a secondary winding of a CT similar to CT 202 of FIG. 2A is evaluated. Table 1 shows technical specifications of an exemplary CT. Exemplary hysteresis curves of the CT for various short-circuited turns in the secondary winding of the CT are shown in FIG. 3. FIG. 3 clearly shows that area sizes surrounded by hysteresis curves ($A_{HYS}$) and zero-crossings of hysteresis curves ($I_{T1\text{-}max}$) highly increase by increasing short-circuited turns ($N_{FS}$).

TABLE 1

Technical specifications of an exemplary CT

| Parameter | Value |
| --- | --- |
| Rated primary current | 2000 (A) |
| Rated secondary current | 1 (A) |
| Accuracy class | 5 P |
| Accuracy limit factor (ALF) | 20 |
| Rated burden | 30 (VA) |
| Secondary winding resistance | 10 (Ω) |
| Number of secondary-winding turns | 2000 |
| Number of primary-winding turns | 1 |
| Outer radius of core | 28 (cm) |
| Inner radius of core | 25 (cm) |
| Core height | 2.5 (cm) |
| Secondary winding conductor diameter | 1 (mm) |

Figure 5:
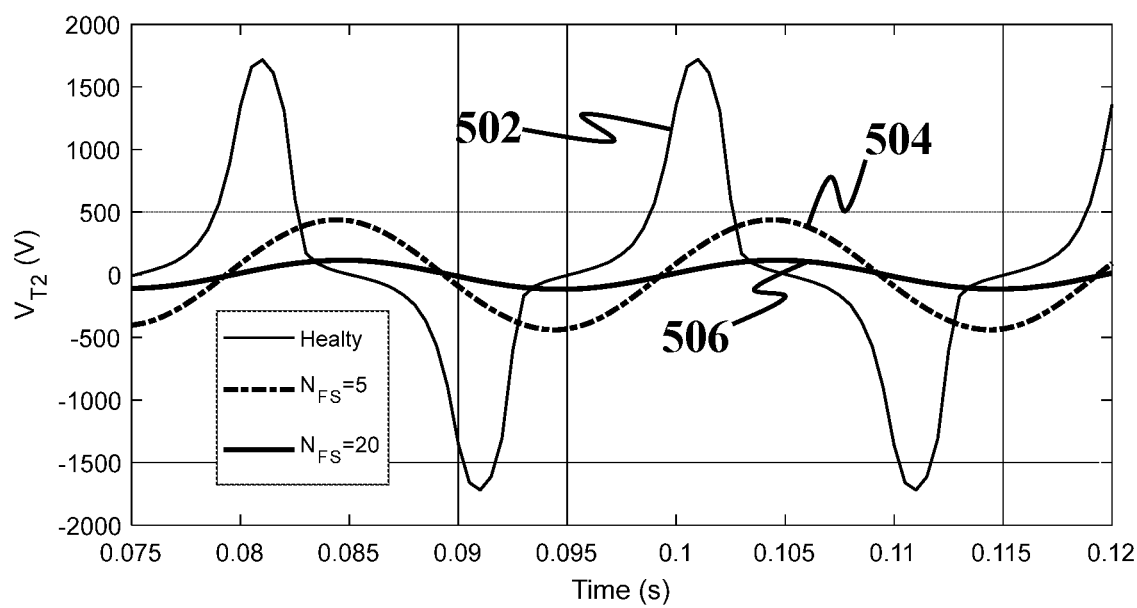
FIG. 5 shows a chart of open-circuit voltage waveforms of a secondary side of a CT when a sinusoidal current is injected to a primary side of the CT for different short-circuited turns in windings of the secondary side, consistent with one or more exemplary embodiments of the present disclosure.

FIG. 5 shows a chart 500 of open-circuit voltage waveforms of a secondary side of a CT when a sinusoidal current with an amplitude of about 170 A is injected to a primary side of the CT for different short-circuited turns in windings of the secondary side, consistent with one or more exemplary embodiments of the present disclosure. An exemplary CT core is mildly saturated due to injecting the sinusoidal current, causing open-circuit voltage waveforms 502, 504, and 506 for zero short-circuited turns (i.e., a healthy CT), 5 short-circuited turns, and 20 short-circuited turns, respectively. An Inter-turn fault may cause a circulating current passing through short-circuited turns, leading to an opposite polarity flux. As a result, the total flux may be reduced and therefore an exemplary open-circuit voltage waveform may approach to a sinusoidal form by increasing short-circuited turns, as shown in waveforms of FIG. 5. Table 2 shows the first fault index and the second fault index of an exemplary CT for different short-circuited turns in the secondary side of the CT. As shown in Table 2, both fault indices clearly distinguish a faulty CT (i.e., $N_{FS}>0$) from a healthy CT (i.e., $N_{FS}=0$). Moreover, the fault indices significantly increase by increasing the short-circuited turns.

TABLE 2

First fault index and second fault index of an exemplary CT
for different short-circuited turns in the secondary winding

| $N_{FS}$ | $IFI_1$ | $IFI_2$ |
|---|---|---|
| 0 | 1 | 1 |
| 1 | 8.7 | 2.79 |
| 5 | 123 | 13.99 |
| 10 | 453 | 26.98 |
| 15 | 995 | 40.09 |
| 20 | 1750 | 53.18 |

Example 2

In this example, performance of an implementation of method 100 for detecting an inter-turn fault in a primary winding of a CT similar to CT 202 of FIG. 2A is evaluated. Table 3 shows technical specifications of an exemplary CT that includes multiple turns in its primary winding. Table 4 shows the first fault index and the second fault index of an exemplary CT for different short-circuited turns in the primary side of the CT. As shown in Table 4, both fault indices clearly distinguish a faulty CT (i.e., $N_{FP}>0$) from a healthy CT (i.e., $N_{FP}=0$). Moreover, the fault indices significantly increase by increasing the short-circuited turns.

TABLE 3

Technical specifications of a CT with
multiple turns in its primary winding

| Parameter | Value |
|---|---|
| Rated primary current | 50 (A) |
| Rated secondary current | 5 (A) |
| Accuracy class | 5 P |
| Accuracy limit factor (ALF) | 10 |
| Rated burden | 10 (VA) |
| Secondary winding resistance | 0.4 (Ω) |
| Secondary winding turn number | 400 |
| Secondary winding layer number | 3 |
| Primary winding turn number | 40 |
| Outer radius of core | 16.7 (cm) |
| Inner radius of core | 15 (cm) |
| Core height | 1.75 (cm) |
| Secondary winding conductor diameter | 2 (mm) |

TABLE 4

First fault index and second fault index of an exemplary CT
for different short-circuited turns in the primary winding

| $N_{FP}$ | $IFI_1$ | $IFI_2$ |
|---|---|---|
| 0 | 1 | 1.00 |
| 1 | 31.97 | 22.80 |
| 2 | 117.37 | 45.86 |
| 3 | 265.06 | 69.87 |

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for inter-turn fault detection in a current transformer (CT), the method comprising:
    obtaining a first normalization factor at an initial time, comprising:
        coupling an AC power supply to a secondary winding of the CT;
        generating, utilizing the AC power supply, a sinusoidal voltage;
        setting an amplitude of the sinusoidal voltage equal to a knee-point voltage of the CT;
        setting a frequency of the sinusoidal voltage equal to a measurement frequency of the knee-point voltage;
        setting the amplitude of the sinusoidal voltage and the frequency of the sinusoidal voltage responsive to the knee-point voltage being higher than a first voltage threshold, according to a set of operations defined by the following:

$$f_{T1} = f_1 \times V_{th1} / U_{kp}$$

$$V_{T1} = V_{th1}$$

where:
        $f_1$ is the measurement frequency,
        $V_{th1}$ is the first voltage threshold,
        $U_{kp}$ is the knee-point voltage of the CT,
        $f_{T1}$ is the frequency of the sinusoidal voltage, and
        $V_{T1}$ is the amplitude of the sinusoidal voltage;
    obtaining, utilizing one or more processors, an initial hysteresis curve of the CT from the sinusoidal voltage; and
    calculating, utilizing the one or more processors, the first normalization factor according to an operation defined by the following:

$$IFI_{1base} = Ah_{HYS} \times Ih_{T1-max}$$

where $IFI_{1base}$ is the first normalization factor, $Ah_{HYS}$ is a size of an area surrounded by the initial hysteresis curve, and $Ih_{T1-max}$ is a zero-crossing of the initial hysteresis curve;

obtaining a second normalization factor at the initial time, comprising:
    generating, utilizing a current source, a sinusoidal current;
    setting a frequency of the sinusoidal current equal to the measurement frequency;
    injecting the sinusoidal current to a primary winding of the CT;
    measuring an initial open-circuit voltage waveform of the secondary winding responsive to injecting the sinusoidal current to the primary winding;
    reducing the amplitude of the initial open-circuit voltage waveform to lower than the second voltage threshold responsive to an amplitude of the initial open-circuit voltage waveform being higher than a second voltage threshold by reducing the frequency of the sinusoidal current;
    adjusting an amplitude of the sinusoidal current until the amplitude of the initial open-circuit voltage waveform satisfies a condition defined according to the following:

$$K_{min} \times \sqrt{2} \times U_{kp} \leq VH_{peak} \leq K_{max} \times \sqrt{2} \times U_{kp}$$

where $VH_{peak}$ is the amplitude of the initial open-circuit voltage waveform and $K_{min}$ and $K_{max}$ are constants where $K_{min} < K_{max}$; and
    calculating, utilizing the one or more processors, the second normalization factor according to an operation defined by the following:

$$IFI_{2base} \times \frac{(VH_{peak})^2}{VH_{h1} - VH_{h3}}$$

where $IFI_{2base}$ is the second normalization factor, $VH_{h1}$ is an amplitude of a first harmonic of the initial open-circuit voltage waveform and $VH_{h3}$ is an amplitude of a third harmonic of the initial open-circuit voltage waveform;

obtaining a first inter-turn fault index of the CT at a test time after the initial time, comprising:
    applying the sinusoidal voltage across a secondary winding of the CT by coupling the AC power supply to the secondary winding;
    measuring, utilizing a voltage sensor, the AC voltage;
    measuring, utilizing a current sensor, an electric current passing through the AC power supply responsive to applying the sinusoidal voltage across the secondary winding;
    obtaining, utilizing the one or more processors, a hysteresis curve of the CT from the sinusoidal voltage and the electric current; and
    calculating, utilizing the one or more processors, the first inter-turn fault index according to an operation defined by the following:

$$IFI_1 = A_{HYS} \times I_{T1-max} / IFI_{1base}$$

where $IFI_1$ is the first inter-turn fault index, $A_{HYS}$ is a size of an area surrounded by the hysteresis curve, and $I_{T1-max}$ is a zero-crossing of the hysteresis curve;
obtaining a second inter-turn fault index of the CT, comprising:
    injecting, utilizing the current source, the sinusoidal current to the primary winding;
    measuring the open-circuit voltage waveform of the secondary winding responsive to injecting the sinusoidal current to the primary winding; and calculating, utilizing the one or more processors, the second inter-turn fault index according to an operation defined by the following:

$$IFI_2 = IFI_{2base} \times \frac{V_{h1} - V_{h3}}{(V_{peak})^2}$$

where $IFI_2$ is the second inter-turn fault index, $V_{h1}$ is an amplitude of a first harmonic of the open-circuit voltage waveform, and $V_{h3}$ is an amplitude of a third harmonic of the open-circuit voltage waveform; and detecting, utilizing the one or processors, an inter-turn fault in the CT responsive to at least one of:
the first inter-turn fault index being larger than a first fault threshold; and
the second inter-turn fault index being larger than a second fault threshold.

2. A method for inter-turn fault detection in a current transformer (CT), the method comprising:
obtaining a first inter-turn fault index of the CT at a test time, comprising:
applying an AC voltage across a secondary winding of the CT by coupling an AC power supply to the secondary winding;
measuring, utilizing a voltage sensor, the AC voltage;
measuring, utilizing a current sensor, an electric current passing through the AC power supply responsive to applying the AC voltage across the secondary winding;
obtaining, utilizing one or more processors, a hysteresis curve of the CT from the AC voltage and the electric current; and
calculating, utilizing the one or more processors, the first inter-turn fault index according to the hysteresis curve;
obtaining a second inter-turn fault index of the CT at the test time, comprising:
injecting, utilizing a current source, an AC current to a primary winding of the CT;
measuring an open-circuit voltage waveform of the secondary winding responsive to injecting the AC current to the primary winding; and
calculating, utilizing the one or more processors, the second inter-turn fault index according to the open-circuit voltage waveform; and
detecting, utilizing the one or processors, an inter-turn fault in the CT responsive to at least one of:
the first inter-turn fault index satisfying a first inter-turn fault condition; and
the second inter-turn fault index satisfying a second inter-turn fault condition.

3. The method of claim 2, wherein calculating the first inter-turn fault index comprises calculating the first inter-turn fault index according to an operation defined by the following:

$$IFI_1 = A_{HYS} \times I_{T1\text{-}max}/IFI_{1base}$$

where:
$IFI_1$ is the first inter-turn fault index,
$A_{HYS}$ is a size of an area surrounded by the hysteresis curve,
$I_{T1\text{-}max}$ is a zero-crossing of the hysteresis curve, and
$IFI_{1base}$ is a first normalization factor.

4. The method of claim 3, further comprising:
obtaining the first normalization factor at an initial time earlier than the test time, comprising:
applying a sinusoidal voltage across the secondary winding;
obtaining, utilizing the one or more processors, an initial hysteresis curve of the CT from the sinusoidal voltage; and
calculating, utilizing the one or more processors, the first normalization factor according to an operation defined by the following:

$$IFI_{1base} = Ah_{HYS} \times Ih_{T1\text{-}max}$$

where:
$Ah_{HYS}$ is a size of an area surrounded by the initial hysteresis curve, and
$Ih_{T1\text{-}max}$ is a zero-crossing of the initial hysteresis curve.

5. The method of claim 4, wherein applying the sinusoidal voltage to the secondary winding comprises:
generating, utilizing the AC power supply, the sinusoidal voltage;
setting an amplitude of the sinusoidal voltage equal to a knee-point voltage of the CT;
setting a frequency of the sinusoidal voltage equal to a measurement frequency of the knee-point voltage; and
setting the amplitude of the sinusoidal voltage and the frequency of the sinusoidal voltage responsive to the knee-point voltage being higher than a first voltage threshold, according to a set of operations defined by the following:

$$f_{T1} = f_1 \times V_{th1}/U_{kp}$$

$$V_{T1} = V_{th1}$$

where:
$f_1$ is the measurement frequency,
$V_{th1}$ is the first voltage threshold,
$U_{kp}$ is the knee-point voltage of the CT,
$f_{T1}$ is the frequency of the sinusoidal voltage, and
$V_{T1}$ is the amplitude of the sinusoidal voltage.

6. The method of claim 5, wherein calculating the second inter-turn fault index comprises calculating the second inter-turn fault index according to an operation defined by the following:

$$IFI_2 = IFI_{2base} \times \frac{V_{h1} - V_{h3}}{(V_{peak})^2}$$

where:
$IFI_2$ is the second inter-turn fault index,
$V_{h1}$ is an amplitude of a first harmonic of the open-circuit voltage waveform,
$V_{h3}$ is an amplitude of a third harmonic of the open-circuit voltage waveform, and
IF 12base is a second normalization factor.

7. The method of claim 6, further comprising:
obtaining the second normalization factor at the initial time, comprising:
generating, utilizing the current source, a sinusoidal current;
setting a frequency of the sinusoidal current equal to the measurement frequency;
injecting the sinusoidal current to the primary winding;
measuring an initial open-circuit voltage waveform of the secondary winding responsive to injecting the sinusoidal current to the primary winding;

reducing the amplitude of the initial open-circuit voltage waveform to lower than the second voltage threshold responsive to an amplitude of the initial open-circuit voltage waveform being higher than a second voltage threshold by reducing the frequency of the sinusoidal current;

adjusting an amplitude of the sinusoidal current until the amplitude of the initial open-circuit voltage waveform satisfies a condition defined according to the following:

$$K_{min} \times \sqrt{2} \times U_{kp} \leq VH_{peak} \leq K_{max} \times \sqrt{2} \times U_{kp}$$

where $VH_{peak}$ is the amplitude of the initial open-circuit voltage waveform and $K_{min}$ and $K_{max}$ are constants where $K_{min} < K_{max}$; and calculating, utilizing the one or more processors, the second normalization factor according to an operation defined by the following:

$$IFI_{2base} \times \frac{(VH_{peak})^2}{VH_{h1} - VH_{h3}}$$

where $VH_{h1}$ is an amplitude of a first harmonic of the initial open-circuit voltage waveform and $VH_{h3}$ is an amplitude of a third harmonic of the initial open-circuit voltage waveform.

8. The method of claim 7, wherein:
applying the AC voltage to the secondary winding comprises applying the sinusoidal voltage to the secondary winding; and
injecting the AC current to the primary winding comprises injecting the sinusoidal current to the primary winding.

9. The method of claim 8, wherein the first inter-turn fault index satisfying the first inter-turn fault condition comprises the first inter-turn fault index being larger than a first fault threshold.

10. The method of claim 8, wherein the second inter-turn fault index satisfying the second inter-turn fault condition comprises the second inter-turn fault index being larger than a second fault threshold.

11. A system for inter-turn fault detection in a current transformer (CT), the system comprising:
an AC power supply configured to:
 be coupled to a secondary winding of the CT; and
 apply an AC voltage across the secondary winding;
a current sensor configured to measure an electric current passing through the AC power supply responsive to applying the AC voltage to the secondary winding;
a current source configured to inject an AC current to a primary winding of the CT;
a voltage sensor configured to:
 measure the AC voltage; and
 measure an open-circuit voltage waveform of the secondary winding responsive to injecting the AC current to the primary winding;
one or more processors configured to access the memory and execute the processor-readable instructions, which, when executed by the one or more processors configures the one or more processors to perform a method, the method comprising:
 obtaining a hysteresis curve of the CT from the AC voltage and the electric current;
 calculating a first inter-turn fault index of the CT according to the hysteresis curve;
 calculating a second inter-turn fault index of the CT according to the open-circuit voltage waveform; and detecting, utilizing the one or processors, an inter-turn fault in the CT responsive to at least one of:
 the first inter-turn fault index satisfying a first inter-turn fault condition; and
 the second inter-turn fault index satisfying a second inter-turn fault condition.

12. The system of claim 11, wherein the AC voltage comprises a sinusoidal voltage.

13. The system of claim 12, wherein the method further comprises:
setting an amplitude of the sinusoidal voltage equal to a knee-point voltage of the CT;
setting a frequency of the sinusoidal voltage equal to a measurement frequency of the knee-point voltage; and
setting the amplitude of the sinusoidal voltage and the frequency of the sinusoidal voltage responsive to the knee-point voltage being higher than a first voltage threshold, according to a set of operations defined by the following:

$$f_{T1} = f_1 \times V_{th1} / U_{kp}$$

$$V_{T1} = V_{th1}$$

where:
 $f_1$ is the measurement frequency,
 $V_{th1}$ is the first voltage threshold,
 $U_{kp}$ is the knee-point voltage of the CT,
 $f_{T1}$ is the frequency of the sinusoidal voltage, and
 $V_{T1}$ is the amplitude of the sinusoidal voltage.

14. The system of claim 13, wherein calculating the first inter-turn fault index comprises calculating the first inter-turn fault index according to an operation defined by the following:

$$IFI_1 = A_{HYS} \times I_{T1\text{-}max} / IFI_{1base}$$

where:
 $IFI_1$ is the first inter-turn fault index,
 $A_{HYS}$ is a size of an area surrounded by the hysteresis curve,
 $I_{T1\text{-}max}$ is a zero-crossing of the hysteresis curve, and
 $IFI_{1base}$ is a first normalization factor.

15. The system of claim 14, wherein the AC current comprises a sinusoidal current.

16. The system of claim 15, wherein the method further comprises:
setting a frequency of the sinusoidal current equal to the measurement frequency;
reducing the amplitude of the open-circuit voltage waveform to lower than the second voltage threshold responsive to an amplitude of the open-circuit voltage waveform being higher than a second voltage threshold by reducing the frequency of the sinusoidal current; and
adjusting an amplitude of the sinusoidal current until the amplitude of the open-circuit voltage waveform satisfies a condition defined according to the following:

$$K_{min} \times \sqrt{2} \times U_{kp} \leq VH_{peak} \leq K_{max} \times \sqrt{2} \times U_{kp}$$

where $V_{peak}$ is the amplitude of the open-circuit voltage waveform and $K_{min}$ and $K_{max}$ are constants where $K_{min} < K_{max}$.

17. The system of claim 16, wherein calculating the second inter-turn fault index comprises calculating the second inter-turn fault index according to an operation defined by the following:

$$IFI_2 = IFI_{2base} \times \frac{V_{h1} - V_{h3}}{(V_{peak})^2}$$

where:
- $IFI_2$ is the second inter-turn fault index,
- $V_{h1}$ is an amplitude of a first harmonic of the open-circuit voltage waveform,
- $V_{h3}$ is an amplitude of a third harmonic of the open-circuit voltage waveform, and
- $IFI_{2base}$ is a second normalization factor.

18. The system of claim 17, wherein the first inter-turn fault condition comprises the first inter-turn fault index being larger than a first fault threshold.

19. The system of claim 17, wherein the second inter-turn fault condition comprises the second inter-turn fault index being larger than a second fault threshold.

* * * * *